United States Patent [19]

Nishino

[11] Patent Number: 5,233,130
[45] Date of Patent: Aug. 3, 1993

[54] SEMICONDUCTOR DEVICE
[75] Inventor: Tomoki Nishino, Kanagawa, Japan
[73] Assignee: Sony Corporation, Tokyo, Japan
[21] Appl. No.: 950,658
[22] Filed: Sep. 23, 1992
[30] Foreign Application Priority Data
Sep. 25, 1991 [JP] Japan ................................ 3-274840
[51] Int. Cl.⁵ .......................................... H01L 23/28
[52] U.S. Cl. .................................. 174/52.2; 257/687; 257/701; 257/787; 361/728; 174/52.4
[58] Field of Search ...................... 174/52.1, 52.2, 52.3, 174/52.4; 361/392, 393, 394, 395, 397, 399; 257/678, 684, 687, 690, 701, 787; 437/209, 211, 215, 217, 219

[56] References Cited
U.S. PATENT DOCUMENTS

| 4,697,203 | 9/1987 | Sakai et al. | 357/72 |
| 4,710,797 | 12/1987 | Tanaka | 357/74 |
| 4,769,344 | 9/1988 | Sakai et al. | 437/216 |
| 5,049,976 | 9/1991 | Demmin et al. | 357/71 |
| 5,153,385 | 10/1992 | Juskey et al. | 174/260 |

Primary Examiner—Leo P. Picard
Assistant Examiner—Bot L. Ledynh
Attorney, Agent, or Firm—Hill, Steadman & Simpson

[57] ABSTRACT

A semiconductor device such as a semiconductor memory has a semiconductor chip bonded to an upper surface of a lead frame die pad, a polyimide film bonded to the upper surface of the semiconductor chip, and a quartz plate having a recess defined in a lower surface thereof, the quartz plate being bonded to an upper surface of the polyimide film with the recess being positioned over the integrated circuit of the semiconductor chip. The recess provides a gap between the polyimide film and the quartz plate for absorbing compressive stresses applied to the semiconductor device. The polyimide film, rather than the quartz plate, may have the recess. A plurality of leads are connected to the electrodes of the semiconductor chip by connecting wires. The lead frame, the semiconductor chip, the polyimide film, the quartz plate, the leads, and the connecting wires are sealed in a resin case. The semiconductor device may additionally have a light-shielding film disposed on the quartz plate for preventing external light from being applied to the semiconductor chip.

6 Claims, 6 Drawing Sheets

FIG. 10

SEMICONDUCTOR DEVICE

BACKGROUND OF THE INVENTION

1. Field of the Invention

The present invention relates to a semiconductor device, and more particularly a semiconductor device which has a means for preventing data storage capabilities from being lowered and also preventing a wiring film from being increased in resistance or broken under compressive stresses that are imposed on a semiconductor chip when it is sealed in a resin case.

2. Description of the Prior Art

Figure 1:
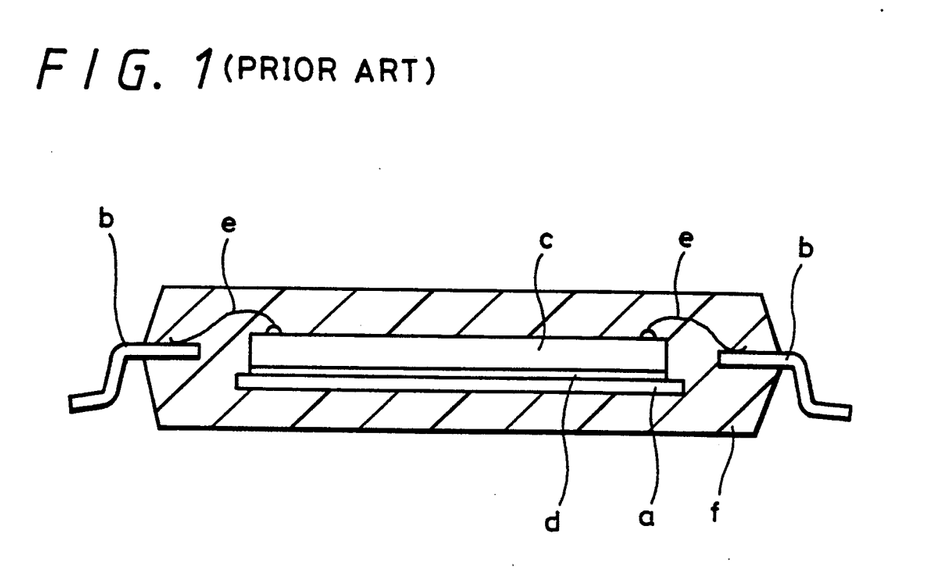
FIG. 1 is a cross-sectional view of a conventional semiconductor device.

FIG. 1 of the accompanying drawings shows a conventional semiconductor device.

As shown in FIG. 1, the conventional semiconductor device includes a lead frame die pad a, leads b, a semiconductor chip c attached to the die pad a through an adhesive layer d by the die bonding process, connecting wires e connecting the electrodes of the semiconductor chip c to the leads b, and a resin case f which encases and seals the semiconductor chip c.

There are strong demands for reducing the size of circuit components and increasing the level of integration in semiconductor devices, particularly semiconductor memories. If the semiconductor device shown in FIG. 1 is designed to meet such demands, however, compressive stresses are developed in the semiconductor chip c upon shrinkage of the resin of the resin case that seals the semiconductor chip c. More specifically, when the semiconductor chip c is sealed in the resin case f, the temperature of the resin is first high, and then gradually decreases down to normal temperature. The resin and the semiconductor chip c, which is made of silicon, have widely different thermal shrinkage factors. In fact, the thermal shrinkage factor of the resin is much larger than that of the semiconductor chip c. As a result, compressive stresses are developed in the semiconductor chip c when it is sealed in the resin case f.

The developed compressive stresses tend to deteriorate the crystal properties of the semiconductor chip c. Therefore, the compressive stresses adversely affect the circuit components of the semiconductor chip c, and increases the leak currents across junctions which are reverse-biased. Particularly, if the semiconductor device comprises a semiconductor memory, then the developed compressive stresses are liable to lower the data storage capabilities thereof and degrade the metal of its wiring film, thus increasing the resistance thereof or breaking the wiring film itself.

The above problems do not manifest themselves insofar as the circuit components, such as memory cells of the semiconductor memory, are comparatively large and the wiring film is comparatively thick and wide. However, the problems cannot be ignored if the circuit components, e.g., such as memory cells, are smaller and the wiring film is thinner and narrower.

OBJECTS AND SUMMARY OF THE INVENTION

In view of the aforesaid problems of the conventional semiconductor device, it is an object of the present invention to provide a semiconductor device which is free of the drawbacks of lowered data storage capabilities and increased resistance and breaks of a wiring, which would otherwise tend to occur under compressive stresses that are imposed on a semiconductor chip when it is sealed in a resin case.

According to the present invention, there is provided a semiconductor device comprising a lead frame having a die pad, a semiconductor chip having an integrated circuit disposed on an upper surface thereof, the semiconductor chip being bonded to an upper surface of the die pad, the semiconductor chip having electrodes, a polyimide film bonded to the upper surface of the semiconductor chip, a quartz plate having a recess defined in a lower surface thereof, the quartz plate being bonded to an upper surface of the polyimide film with the recess being positioned over the integrated circuit of the semiconductor chip, a plurality of leads connected to the electrodes of the semiconductor chip by connecting wires, and a resin case, wherein the lead frame, the semiconductor chip, the polyimide film, the quartz plate, the leads, and the connecting wires are sealed in the resin case. The recess may be divided into a plurality of separate recesses.

According to the present invention, there is also provided a semiconductor device comprising a lead frame having a die pad, a semiconductor chip having an integrated circuit disposed on an upper surface thereof, the semiconductor chip being bonded to an upper surface of the die pad, the semiconductor chip having electrodes, a polyimide film having a recess defined in an upper surface thereof, the polyimide film being bonded to the upper surface of the semiconductor chip with the recess being positioned over the integrated circuit of the semiconductor chip, a quartz plate bonded to the upper surface of the polyimide film, a plurality of leads connected to the electrodes of the semiconductor chip by connecting wires, and a resin case, wherein the lead frame, the semiconductor chip, the polyimide film, the quartz plate, the leads, and the connecting wires are sealed in the resin case. The semiconductor device may further include a light-shielding film disposed on an upper surface of the quartz plate. The recess may be divided into a plurality of separate recesses.

According to the present invention, there is provided a semiconductor device comprising a lead frame having a die pad, a semiconductor chip having an integrated circuit disposed on an upper surface thereof, the semiconductor chip having electrodes, a polyimide film having a recess defined in an upper surface thereof, the polyimide film being bonded to the upper surface of the semiconductor chip with the recess being positioned over the integrated circuit of the semiconductor chip, the die pad being bonded to the upper surface of the polyimide film, a plurality of leads connected to the electrodes of the semiconductor chip by connecting wires, and a resin case, wherein the lead frame, the semiconductor chip, the polyimide film, the leads, and the connecting wires are sealed in the resin case.

The above and other objects, features, and advantages of the present invention will become apparent from the following description of illustrative embodiments thereof to be read in conjunction with the accompanying drawings, in which like reference numerals represent the same or similar objects.

DETAILED DESCRIPTION OF THE PREFERRED EMBODIMENTS

Like or corresponding reference characters denote like or corresponding parts throughout views.

Figure 2:
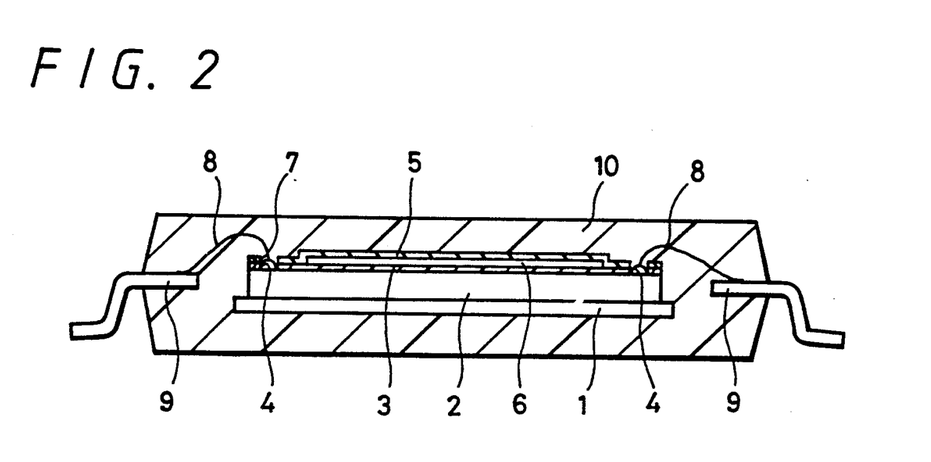
FIG. 2 is a cross-sectional view of a semiconductor device according to a first embodiment of the present invention.
Figure 3:
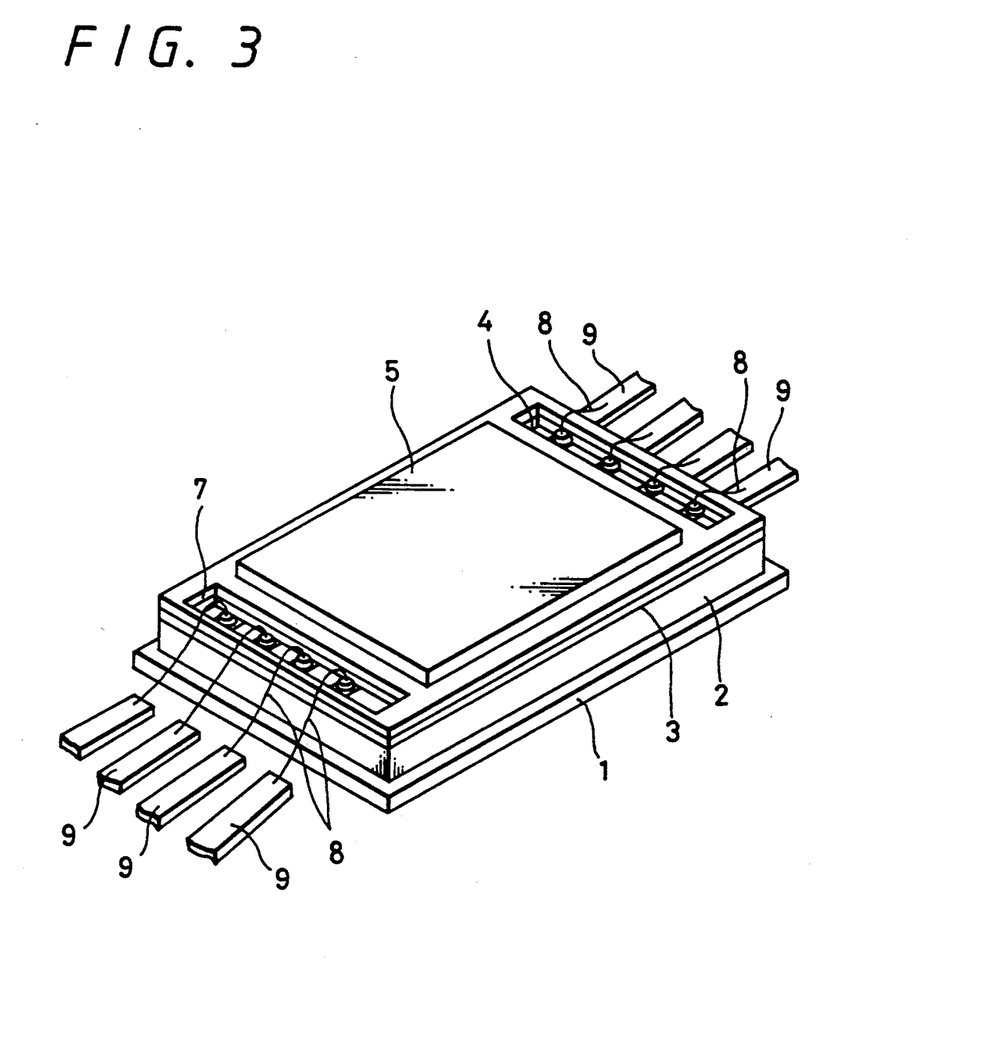
FIG. 3 is a perspective view showing an assembly of the semiconductor device according to the first embodiment before it is encased and sealed in a resin case.
Figure 4:
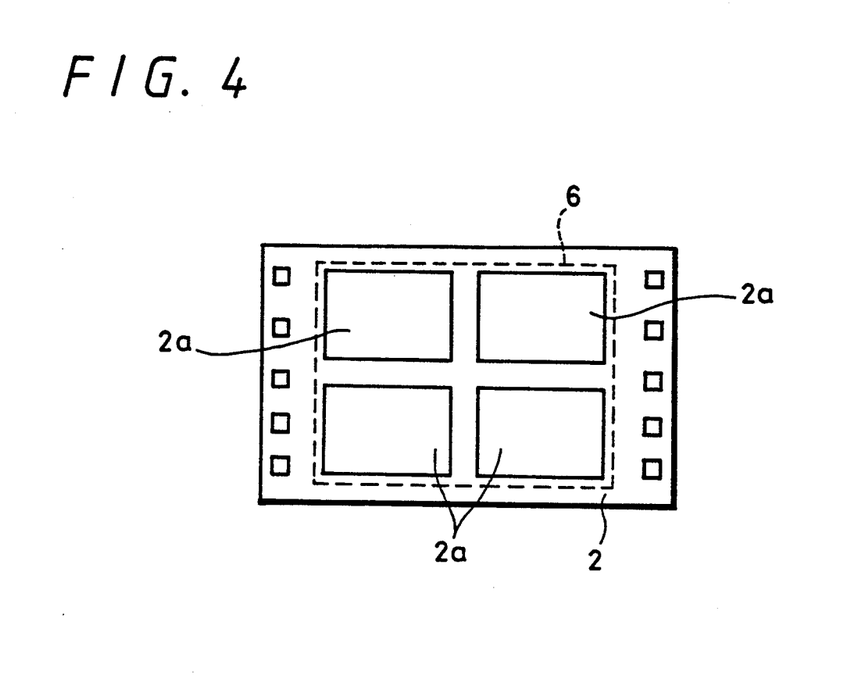
FIG. 4 is a plan view of a semiconductor chip of the semiconductor device according to the first embodiment.

FIGS. 2 through 4 show a semiconductor device according to a first embodiment of the present invention. The semiconductor device is typically constructed as a semiconductor memory.

As shown in FIGS. 2 and 3, the semiconductor device includes a lead frame having a die pad 1 and a semiconductor chip 2 attached to the upper surface of the die pad 1 by the die bonding process. The semiconductor chip 2 has an integrated circuit disposed on its upper surface.

The semiconductor device also includes a polyimide film 3 bonded to the upper surface of the semiconductor chip 2 by a thermoplastic adhesive, for example. The polyimide film 3 has a thickness of about 0.1 mm. The polyimide film 3 has electrode holes 4 defined therein in positions aligned with the respective electrodes of the semiconductor chip 2.

A rigid plate 5 of quartz, which has a thickness ranging from 0.3 to 0.4 mm, is bonded at its peripheral edge to the upper surface of the polyimide film 3 by a thermal pressing process. The rigid plate 5 has a recess 6 defined in its lower reverse side facing the polyimide film 3, the recess 6 having a depth of about 0.2 mm. The quartz of the rigid plate 5 has a coefficient of thermal expansion close to that of the silicon which the semiconductor chip 2 is made of. The rigid plate 5 also has electrode holes 7 defined therein in positions aligned with the respective electrodes of the semiconductor chip 2. The recess defined in the reverse side of the rigid plate 5 creates a gap 6 between the ridded plate 5 and the polyimide film 3.

The electrodes of the semiconductor chip 2 are connected to respective leads 9 by connecting wires 8, respectively. The assembly composed of the above components is encased and sealed in a resin case 10.

As described above, the polyimide film 3 is mounted on the semiconductor chip 2, and the rigid plate 5 of quartz is bonded to the polyimide film 3 with the gap 6 defined between the rigid plate 5 and the polyimide film 3. Compressive stresses that are developed and applied to the semiconductor chip 2 when the components of the semiconductor device are sealed in the resin case 10 are lessened by the gap 6 and the polyimide film 3. More specifically, the gap 6 allows the rigid plate 5 to flex therein upon application of compressive stresses to the rigid plate 5. Since the polyimide film 3 is resilient, it can resiliently absorb compressive stresses exerted thereto. Inasmuch as the coefficient of thermal expansion of the quartz of the rigid plate 5 is close to that of the silicon of the semiconductor chip 2, the semiconductor chip 2 is substantially free of thermally induced compressive stresses which would otherwise be developed by the rigid plate 5 when they are sealed in the resin case 10.

Therefore, any compressive stresses applied to the surface of the semiconductor chip 2 are very small, and the crystal properties of the semiconductor chip 2 are protected from being deteriorated by such compressive stresses. As a consequence, the leak currents flowing across reverse-biased junctions of the semiconductor device are prevented from increasing, and the data storage characteristics of the semiconductor device when it is constructed as a semiconductor memory are prevented from being lowered. Furthermore, an aluminum wiring film in the semiconductor device is prevented from being increased in resistance and also from broken.

FIG. 4 shows in plan the semiconductor device according to the first embodiment. In FIG. 4, the gap 6 is illustrated by broken lines. The semiconductor chip 2 is composed of plural memory cell arrays 2a which are covered with the gap 6 that is positioned above the memory cell arrays 2a.

Compressive stresses applied to the semiconductor chip 2 are greater toward its central area, and become progressively smaller toward its outer peripheral edges. Therefore, it is often less necessary to reduce compressive stresses at the peripheral edges of the semiconductor chip 2 than at the central area thereof. Consequently, the gap 6 may be of a smaller size which is present in the central area of the semiconductor chip 2 but terminates short of the peripheral edges thereof.

Figure 5:
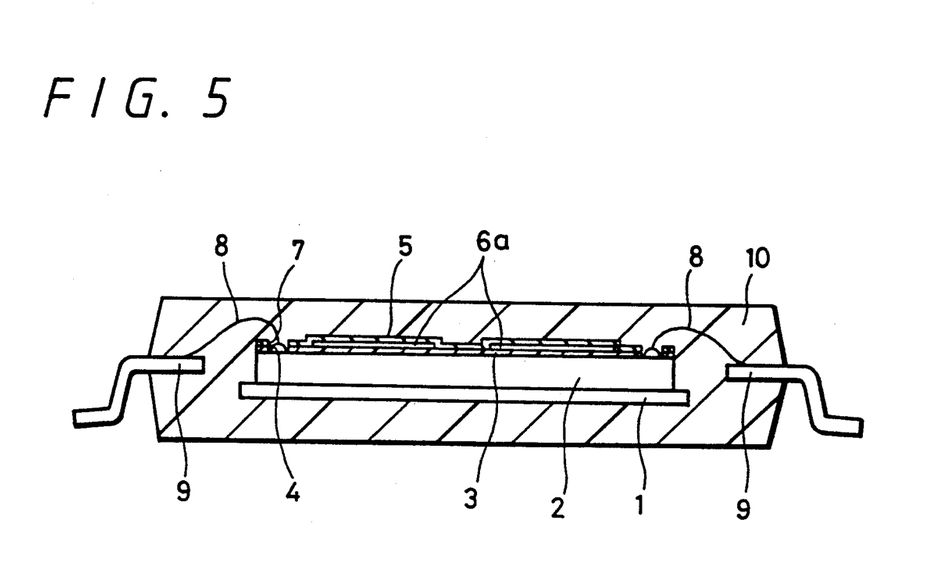
FIG. 5 is a cross-sectional view of a semiconductor device according to a second embodiment of the present invention.
Figure 6:
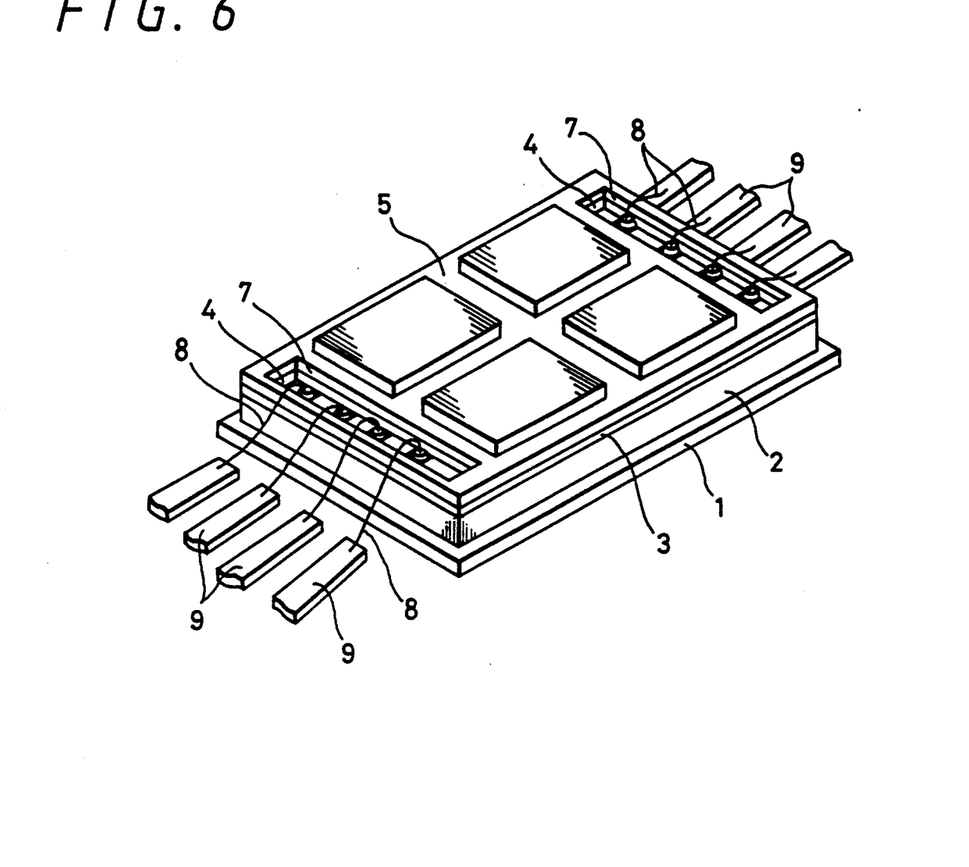
FIG. 6 is a perspective view showing an assembly of the semiconductor device according to the second embodiment before it is encased and sealed in a resin case.
Figure 7:
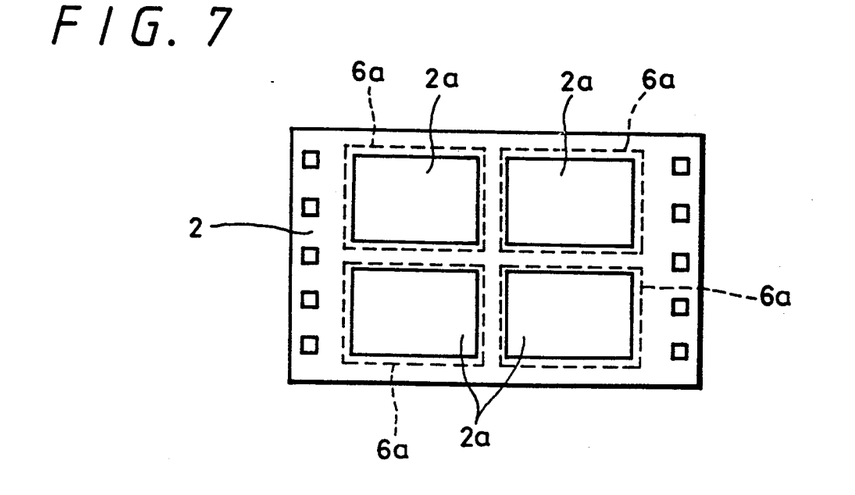
FIG. 7 is a plan view of a semiconductor chip of the semiconductor device according to the second embodiment.

FIGS. 5 through 7 show a semiconductor device according to a second embodiment of the present invention.

The semiconductor device according to the second embodiment differs from the semiconductor device according to the first embodiment in that the rigid plate 5 of quartz has a plurality of separate recesses defined in the reverse side thereof, thus providing a plurality of separate gaps 6a between the rigid plate 5 and the polyimide film 3. The gaps 6a are positioned above the respective memory cell arrays 2a of the semiconductor chip 2.

In the second embodiment, because the gaps 6a are provided respectively above the memory cell arrays 2a of the semiconductor chip 2, as described above, the rigid plate 5 of quartz is prevented from cracking even if each of the memory cell arrays 2a has a relatively large area due to an increased storage capacity of the semiconductor chip 2. More specifically, in the case where the semiconductor device has only one gap between the rigid plate 5 and the polyimide film 3 as with the first embodiment, the gap becomes naturally large in size if the semiconductor chip 2 increases in its size for a larger storage capacity. Accordingly, the rigid plate 5 of quartz tends to crack as concentrated compressive stresses are liable to be applied directly to a local region of the rigid plate 5. On the other hand, the separate gaps 6a are effective to distribute concentrated compressive stresses applied to a local region of the rigid plate 5, and hence compressive stresses applied to each of the separate gaps 6a are relatively small. Consequently, the separate gaps 6a can protect the rigid plate 5 from cracking due to applied compressive stresses.

Figure 8:
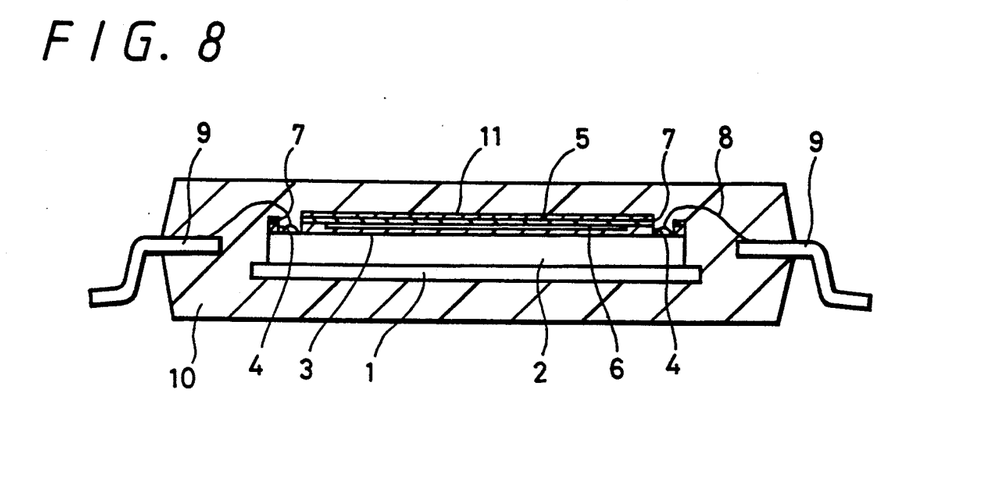
FIG. 8 is a cross-sectional view of a semiconductor device according to a third embodiment of the present invention.
Figure 9:
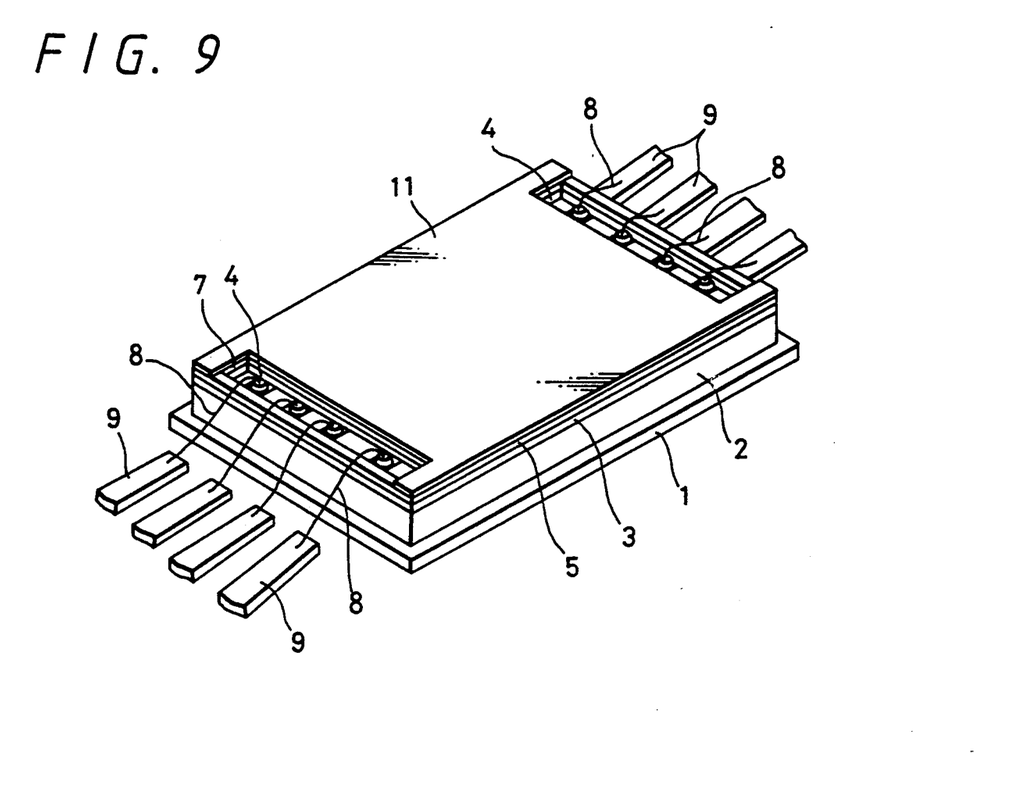
FIG. 9 is a perspective view showing an assembly of the semiconductor device according to the third embodiment before it is encased and sealed in a resin case.

A semiconductor device according to a third embodiment is illustrated in FIGS. 8 and 9.

The semiconductor device shown in FIGS. 8 and 9 differs from the semiconductor device shown in FIGS. 2 through 4 in that the polyimide film 3 has a recess defined in its surface facing the rigid plate 5 of quartz, providing the gap 6 between the polyimide film 3 and the rigid plate 5, and that a light-shielding film 11 of a metal such as chromium is deposited on the upper surface of the rigid plate 5 by way of vapor deposition. The gap 6 between the polyimide film 3 and the rigid plate 5 serves to absorb compressive stresses that would otherwise be imposed on the semiconductor chip 2 when the components are sealed in the resin case 10.

The resin of the resin case 10 has a light-shielding capability to prevent light from passing therethrough. However, if the thickness of the resin case 10 is greatly reduced because of a low profile design of the semiconductor device, then the resin cannot completely block external light that is applied to the semiconductor device. When external light applied to the semiconductor device would pass through the resin and fall on the surface of the semiconductor chip 2, it would be apt to cause an parasitic diode or phototransistor to be produced which would then increase the leak current and lower the data storage characteristics of the semiconductor memory.

The light-shielding film 11 on the surface of the rigid plate 5 remote from the polyimide film 3 is effective to block external light for thereby preventing the generation of an parasitic diode or phototransistor. The light-shielding film 11 does not extend into regions where it would otherwise be short-circuited to the connecting wires 8. Stated otherwise, the light-shielding film 11 is positioned sufficiently remotely from the connecting wires 8 to prevent a short circuit from occurring therebetween.

The gap 6 shown in FIG. 8 may be divided into a plurality of gaps as shown in FIGS. 5 and 7.

In each of the first through third embodiments, the polyimide film 3 and the rigid quartz plate 5 are formed in the semiconductor device as follows:

A base film of polyimide is shaped into a polyimide film 3 of predetermined pattern by photoetching, and a quartz plate is also shaped into a rigid plate 5 of quartz of predetermined pattern by photoetching. The polyimide film 3 and the rigid quartz plate 5 are then bonded to each other by a thermal pressing process, and thereafter bonded to the semiconductor chip 2 before the semiconductor chip 2 is attached to the die pad 1 according to the die bonding process.

Alternatively, the polyimide film 3 and the rigid quartz plate 5 may be bonded to the semiconductor chip 2 when the semiconductor chip 2 is in the form of a wafer.

Figure 10:
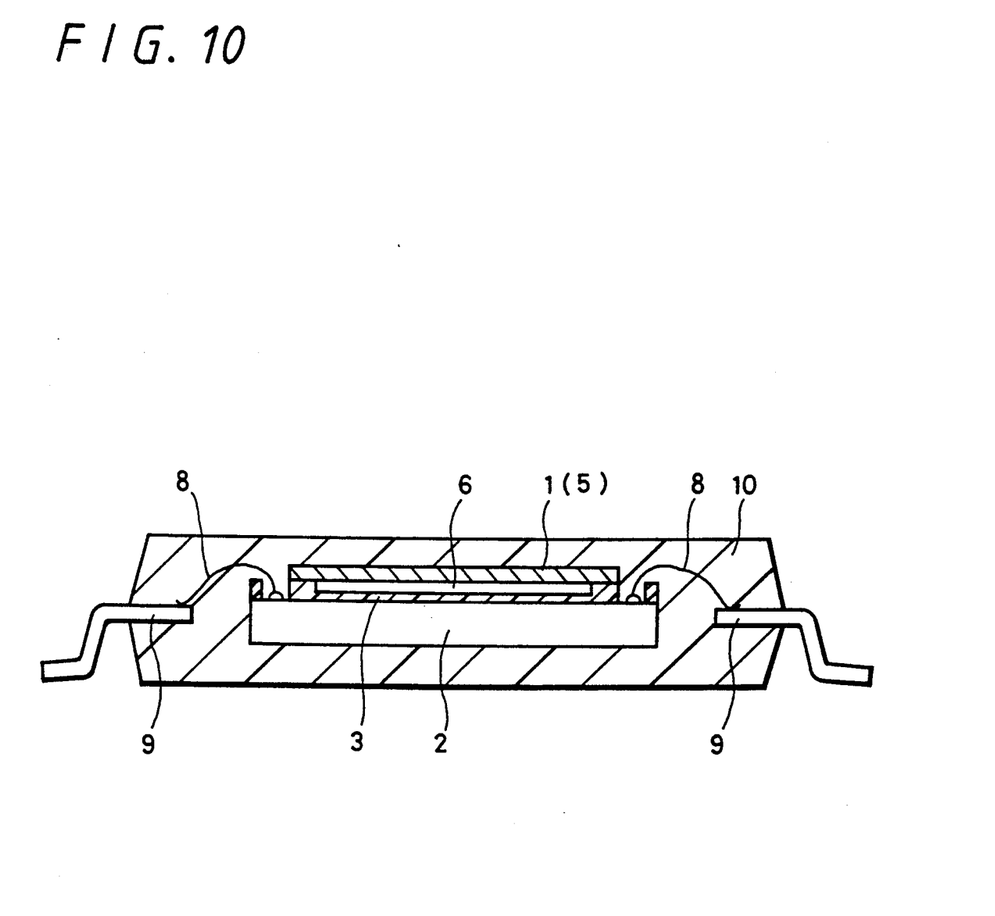
FIG. 10 is a cross-sectional view of a semiconductor device according to a fourth embodiment of the present invention.

FIG. 10 shows a semiconductor device according to a fourth embodiment of the present invention.

In FIG. 10, the die pad 1 is used in place of the rigid plate 5 of quartz.

Generally, the die pad is bonded to the reverse side of the semiconductor chip 2 as shown in FIGS. 2, 3, 5, 6, 8, and 9. However, the die pad may be connected to the upper surface of the semiconductor chip 2 insofar as an electric insulation is provided between the die pad and the upper surface of the semiconductor chip 2. In the fourth embodiment, the polyimide film 3 which is electrically insulative is used as such an electric insulation is provided between the die pad and the upper surface of the semiconductor chip. More specifically, the polyimide film 3 has a recess defined in the upper surface thereof, and the die pad 1 is positioned upwardly of the polyimide film 3 and bonded to the peripheral edges of the polyimide film 3. In FIG. 10, the gap 6 is defined by the recess between the die pad 1 and the polyimide film 3.

In the fourth embodiment, the semiconductor device requires no special rigid plate of quartz, and the die pad 1 upwardly of the polyimide film 3 has a light-shielding capability to block external light as the die pad 1 is made of metal. Therefore, the die pad 1 performs a dual function, i.e., it protects the semiconductor chip 2 from compressive stresses, and also blocks external light for preventing a parasitic diode or transistor from being generated.

Having described preferred embodiments of the invention with reference to the accompanying drawings, it is to be understood that the invention is not limited to that precise embodiments and that various changes and modifications could be effected by one skilled in the art without departing from the spirit or scope of the invention as defined in the appended claims.

What is claimed is:

1. A semiconductor device comprising:
   a lead frame having a die pad;
   a semiconductor chip having an integrated circuit disposed on an upper surface thereof, said semiconductor chip being bonded to an upper surface of said die pad, said semiconductor chip having electrodes;
   a polyimide film bonded to the upper surface of said semiconductor chip;
   a quartz plate having a recess defined in a lower surface thereof, said quartz plate being bonded to an upper surface of said polyimide film with said recess being positioned over the integrated circuit of said semiconductor chip;
   a plurality of leads connected to said electrodes of the semiconductor chip by connecting wires; and
   a resin case, wherein said lead frame, said semiconductor chip, said polyimide film, said quartz plate, said leads, and said connecting wires are sealed in said resin case.

2. A semiconductor device according to claim 1, wherein said recess is divided into a plurality of separate recesses.

3. A semiconductor device comprising:
   a lead frame having a die pad;
   a semiconductor chip having an integrated circuit disposed on an upper surface thereof, said semiconductor chip being bonded to an upper surface of said die pad, said semiconductor chip having electrodes;
   a polyimide film having a recess defined in an upper surface thereof, said polyimide film being bonded to the upper surface of said semiconductor chip with said recess being positioned over the integrated circuit of said semiconductor chip;

a quartz plate bonded to the upper surface of said polyimide film;

a plurality of leads connected to said electrodes of the semiconductor chip by connecting wires; and a resin case, wherein said lead frame, said semiconductor chip, said polyimide film, said quartz plate, said leads, and said connecting wires are sealed in said resin case.

4. A semiconductor device according to claim 3, further including a light-shielding film disposed on an upper surface of said quartz plate.

5. A semiconductor device according to claim 3, wherein said recess is divided into a plurality of separate recesses.

6. A semiconductor device comprising:

a lead frame having a die pad;

a semiconductor chip having an integrated circuit disposed on an upper surface thereof, said semiconductor chip having electrodes;

a polyimide film having a recess defined in an upper surface thereof, said polyimide film being bonded to the upper surface of said semiconductor chip with said recess being positioned over the integrated circuit of said semiconductor chip;

said die pad being bonded to the upper surface of said polyimide film;

a plurality of leads connected to said electrodes of the semiconductor chip by connecting wires; and a resin case, wherein said lead frame, said semiconductor chip, said polyimide film, said leads, and said connecting wires are sealed in said resin case.

* * * * *